(12) United States Patent
Alzaher

(10) Patent No.: US 9,306,508 B1
(45) Date of Patent: Apr. 5, 2016

(54) RECONFIGURABLE INTERGRATOR/DIFFERENTIATOR CIRCUIT BASED ON CURRENT FOLLOWER

(71) Applicant: King Fahd University of Petroleum and Minerals, Dhahran (SA)

(72) Inventor: Hussain Abdullah Alzaher, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/626,417

(22) Filed: Feb. 19, 2015

(51) Int. Cl.
*H03F 1/42* (2006.01)
*H03F 3/68* (2006.01)

(52) U.S. Cl.
CPC .. *H03F 1/42* (2013.01); *H03F 3/68* (2013.01); *H03F 2200/135* (2013.01); *H03F 2200/264* (2013.01)

(58) Field of Classification Search
CPC .................................................... H03F 3/45973
USPC ...................................... 330/291, 75, 99, 260
See application file for complete search history.

(56) References Cited

U.S. PATENT DOCUMENTS

| | | | |
|---|---|---|---|
| 4,176,329 A | 11/1979 | Moskowitz | |
| 5,959,871 A | 9/1999 | Pierzchala et al. | |
| 6,353,367 B1 * | 3/2002 | Chiu | H03F 1/14 330/100 |
| 6,897,731 B2 * | 5/2005 | Zhang | H03F 1/523 330/291 |
| 7,484,139 B2 * | 1/2009 | Watts | H03F 1/52 330/265 |
| 8,482,343 B1 | 7/2013 | Alzaher | |
| 2013/0063214 A1 * | 3/2013 | Galal | H03F 1/301 330/291 |
| 2015/0054584 A1 * | 2/2015 | Chang | H03M 1/66 330/291 |

* cited by examiner

*Primary Examiner* — Henry Choe
(74) *Attorney, Agent, or Firm* — Oblon, McClelland, Maier & Neustadt, L.L.P.

(57) ABSTRACT

A reconfigurable integrator/Differentiator circuit includes: a first input terminal; a first output terminal; a first current follower amplifier having a second input terminal, a second inverting output terminal, and a third non-inverting output terminal, wherein the second inverting output terminal provides feed back to the first input terminal and the third non-inverting output terminal is directly connected to the first output terminal; a second current follower amplifier having a third input terminal, a fourth inverting output terminal, and a fifth non-inverting output terminal, wherein the fourth inverting output terminal provides feed back to the first input terminal and the fifth non-inverting output terminal is directly connected to the first output terminal; a single resistor being connected between the first input terminal and the second input terminal, and a single capacitor being connected between the first input terminal and the third input terminal.

6 Claims, 8 Drawing Sheets

RECONFIGURABLE INTERGRATOR/DIFFERENTIATOR CIRCUIT BASED ON CURRENT FOLLOWER

STATEMENT OF ACKNOWLEDGEMENT

This project was funded by the National Plan for Science, Technology and Innovation (MAARIFAH)—King Abdulaziz City for Science and Technology—the Kingdom of Saudi Arabia, award number (12-ELE2383-04).

TECHNICAL FIELD

The exemplary embodiments described herein are related to the field of reconfigurable integrators/differentiators.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Configurable analog blocks (CABs) are the central parts for Field Programmable Analog Arrays (FPAA). The hierarchical designs of FPAAs offer cost-efficient solutions for a relatively small volume of analog application-specific integrated circuits (ASICs) and for quick system prototyping. The CABs can be structured to implement signal amplification, summation, integration, differentiation and signal conditioning circuits. Therefore, they have a wide range of applications including filters, data converters, flexible analog front ends (AFEs) for data acquisition, and sensor signal conditioning, and precision voltage monitoring as described in A. Basu, S. Brink, C. Schlottmann, S. Ramakrishnan, C. Petre, S. Koziol, F. Baskaya, C. Twigg, and P. Hasler, ("A floating-gate-based field-programmable analog array," IEEE J. Solid-State Circuits, vol. 45, no. 9, pp. 1781-1794, September 2010—incorporated herein by reference) and A. Malcher, and P. Falkowski, ("Analog Reconfigurable Circuits," Intl. Journal of Electronics and Telecommunications, vol. 60, no. 1, pp. 15-26, March 2014—incorporated herein by reference). However, as recognized by the present inventor, generally either the bandwidth or the dynamic range of these circuits is limited.

SUMMARY

In one embodiment, there is provided a reconfigurable integrator/differentiator Circuit, including: a first input terminal input of the circuit; a first output terminal output of the circuit; a first current follower amplifier having a second input terminal of a first current follower, a second inverting output terminal, and a third non-inverting output terminal, wherein the second inverting output terminal provides feed back to the first input terminal and the third non-inverting output terminal is directly connected to the first output terminal; a second current follower amplifier having a third input terminal of the second current follower, a fourth inverting output terminal, and a fifth non-inverting output terminal, wherein the fourth inverting output terminal provides feed back to the first input terminal and the fifth non-inverting output terminal is directly connected to the first output terminal; a single resistor being connected between the first input terminal and the second input terminal of the first current follower amplifier; and a single capacitor being connected between the first input terminal and the third input terminal of the second current follower amplifier.

In another embodiment, the single resistor and the single capacitor are used for both integration and differentiation operations to reduce silicon area.

In another embodiment, the first current follower amplifier and the second current follower amplifier include one or more differential pairs in parallel with first output stage to provide multiple output currents.

In another embodiment, respective input stages and output stages of the first current follower amplifier and the second current follower amplifier operate independently through controlling a biasing current at the output stages.

In another embodiment, the circuit operates as an integrator when output stages of the first current follower amplifier are turned on and output stages of the second current follower amplifier are turned off, and the circuit operates as a differentiator when the output stages of the first current follower amplifier are turned off and the output stages of the second current follower are turned on.

In another embodiment, the first current follower amplifier and the second current follower amplifier include feedback loops to reduce the input resistance, maintain virtual ground for AC operation, and adjust the first output currents to follow the input current.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1A:
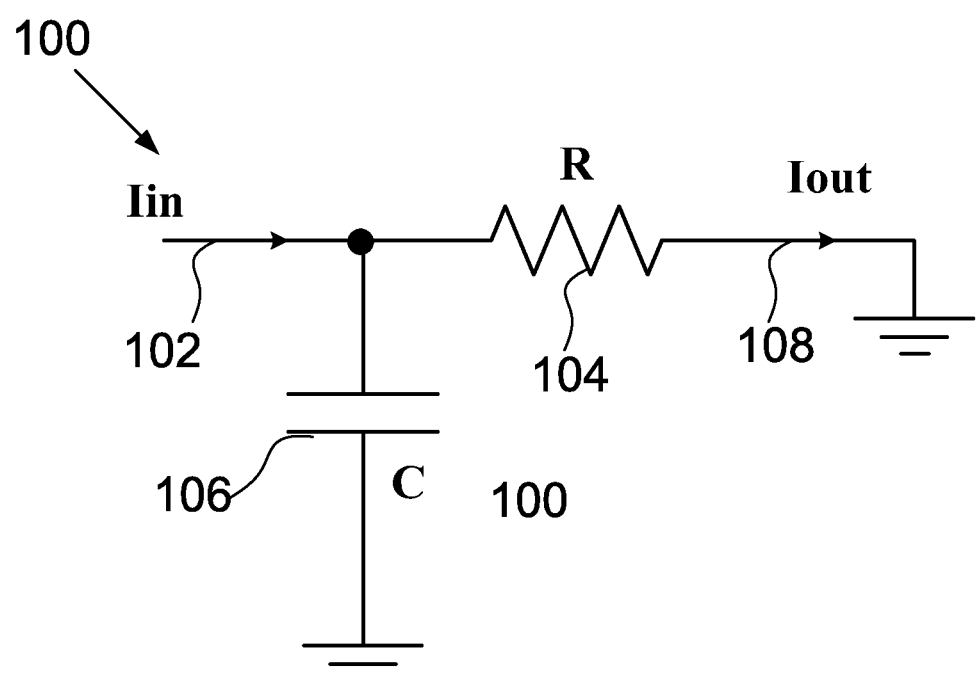
FIG. 1A is an exemplary circuit schematic of a current mode passive integrator.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "about," and similar terms generally refer to ranges that include the identified value within a margin of 20%, 10%, or preferably 5%, and any values therebetween.

The following is an assessment of publications and is intended not only as a review of conventional approach, but also on the inventor's recognition of attributes and limitation of these approaches, which set a baseline for the novel embodiments described herein.

Programmable analog CABs are commercially available and several related circuits have also been presented. However, generally either the bandwidth or the dynamic range of these circuits is limited. Most designs are based on a switched-capacitor technique wherein the system bandwidth is limited by the clock and sampling rate. Analog CABs based on operational amplifiers or an active-RC approach preserve the high linearity of switched-capacitor technique and improve the system bandwidth as described in C. A. Looby and C. Lyden, ("Op-amp based CMOS field-programmable analogue array," Proc. IEE Circuits Dev. Syst., vol. 147, pp. 93-95, 2000—incorporated herein by reference). But these designs still require relatively large current consumptions to operate in MHz ranges. Whereas, transconductance amplifier (gm) based CABs such as B. Pankiewicz, M., Wojcikowski, S., Szczepanski, Y. Sun, ("A field programmable analog array for CMOS continuous time OTA-C filter applications," IEEE J. Solid-State Circuits, vol. 37, no. 2, pp. 125-136, February 2002—incorporated herein by reference), S. A. Mahmoud, ("Digitally controlled CMOS balanced output transconductor and application to variable gain amplifier and Gm-C filter on field programmable analog array," J. Circuits Syst. Comput., vol. 14, pp. 667-684, 2005—incorporated herein by reference), F. Henrici, J. Becker, A. Buhmann et al., ("A Continuous-Time Field Programmable Analog Array Using Parasitic Capacitance Gm-C Filters," ISCAS, pp. 2236-2239, 2007—incorporated herein by reference), Trendelenburg, S., De Dorigo, D., Henrici, F., Becker, J., Manoli, Y, ("Instantiation of high order filters on a continuous-time field-programmable analog array" MWSCAS 2008. 51st Midwest Symposium on Circuits and Systems, 10-13 pp. 294-297, August 2008—incorporated herein by reference), can operate at higher bandwidths but suffer from limited linearity particularly for low supply voltages as described in Y. P. Tsividis, "Integrated Continuous-Time Filter Design-An Overview," IEEE J. Solid-State Circuits, vol. 29, pp. 166-176, March 1994-incorporated herein by reference).

Current-mode active elements, like the second generation current conveyor (CCII) and the current feedback amplifier (CFA) exhibit attractive characteristics such as wide frequency operating range, low power, high linearity, high slew rate and simple circuitry as described in G. Cataldo, A. Grasso, and S. Pennisi, ("Two CMOS Current Feedback Operational Amplifiers," IEEE Tran. on Circuits and Systems-II, vol. 54, pp. 944-948, 2007—incorporated herein by reference). But the main problem with CCII or CFA based CABs such as described in V. C. Gaudet and P. G. Gulak, "CMOS implementation of a current conveyor-based field programmable analog array," Conf. Record of the Third-First Asilomar Conf. Signals, Systems and Computers, vol. 2, p. 1156, 1997—incorporated herein by reference), C. Premont, R. Grisel, N. Abouchi, J.-P. Chante, "A current conveyor based field programmable analog array," Analog Integrated Circuits and Signal Processing, vol. 17, no. 1, pp. 105-124, 1998—incorporated herein by reference), A. M. Madian, S. A. Mahmoud and A. M. Soliman, "Configurable analog block based on CFOA and its application," WSEAS Trans. Electron., vol. 5, pp. 26-31, 2008—incorporated herein by reference), S. A. Mahmoud and E. A. Soliman, ("Low voltage current conveyor-based field programmable analog array," Journal of Circuits, Systems, and Computers, vol. 20, no. 8, pp. 1677-1701, 2011—incorporated herein by reference) is the complexity of the active elements. The CCII is a three terminal device that basically consists of a voltage follower (VF) (between Y and X input terminals) whose current is sensed and convey to high output terminal Z. The CFA is a four terminal device which consists of a CCII followed by a VF. The complexity is automatically negatively reflected in the power consumption, dynamic range and area efficiency. In addition, VFs usually suffer from a limited input/output signal swing especially when operated from a low supply voltage as described in H. Alzaher, N. Tasadduq, and F. Al-Ammari, ("Optimal Low Power Complex Filters," IEEE Transactions on Circuits and Systems-I-Regular Papers, vol. 60, no. 4, pp. 885-895, April 2013—incorporated herein by reference). The limited input/output voltage swing limits the dynamic range of circuits based on CCIIs and CFAs.

The second limitation of the available solutions is that the number of functions implemented is relatively limited since most of the circuits use MOS transistor based switches. Traditionally, FPAA's structure interconnection networks are implemented using switches or pass transistors. In addition, to the nonlinearity associated with these switches as described in T. W. Brown, T. S. Fiez, and M. Hakkarainen, ("Prediction and characterization of frequency dependent MOS switch linearity and the design implications," Custom Integrated Circuits Conference, pp. 237-240, September 2006—incorporated herein by reference), the parasitic effect of numerous switches dramatically degrades the system performance as the array size increases as described in J. Becker, F. Henrici, S. Trendelenburg, M. Ortmanns, and Y. Manoli, ("A continuous-time hexagonal field-programmable analog array in 0.13 µm CMOS with 186 MHz GBW," IEEE Int. Solid-State Circ. Conf., pp. 70-71, February 2008—incorporated herein by reference). A possible solution to this problem is through replacing the interconnection network by direct connection between on/off CABs as suggested in J. Becker, F. Henrici, S. Trendelenburg, M. Ortmanns and Y. Manoli, "A field programmable analog array of 55 digitally tunable OTAs in a hexagonal lattice", IEEE J. Solid-State Circuits, vol. 43, pp. 2759-2768, 2008—incorporated herein by reference).

The CFs or more generally current amplifiers (CAs) do not suffer from the problems of limited input/output signal swing of CCII or CFA and have higher bandwidth. Therefore, it is attractive to design CABs based on CFs only. Furthermore, the bandwidth and the closed-loop gain are almost independent and a high voltage swing is not usually required as described in Pennisi, S.: 'A low-voltage design approach for class-AB current-mode circuits', IEEE Trans. Cir. Syst. II, vol. 49, no. 4, pp. 273-279, April 2002—incorporated herein by reference), Palmisano, G., Palumbo, G., and Pennisi, S.: 'High-drive CMOS current amplifier', IEEE J. Solid State Circuits, vol. 33, no. 2, pp. 228-236, February 1998—incorporated herein by reference), and H. Alzaher, O. Al-Ees, and N. Tasadduq, "Programmable Multi-Gain Current Amplifier, " IET Circuits, Devices & Systems, vol. 6, no. 6, p. 421-428, November 2012—incorporated herein by reference).

Therefore, the CFs and CAs are the simplest current-mode devices since they are a subpart of several devices such as CCII, CFA and transresistance amplifier (TRA) as described in Elwan, H., Soliman, A. M., and Ismail, M., ("A CMOS Norton amplifier-based digitally controlled VGA for low-power wireless applications", IEEE Trans. Cir. Syst. II, vol. 48, no. 3, pp. 245-254, March 2001—incorporated herein by reference). Therefore, such structures are expected to work at relatively high frequencies with an improved dynamic range, lower power consumption and less area. Switches in a signal path are avoided through adopting direct connection between on/off CABs following a similar procedure explained in S. A.

Mahmoud and E. A. Soliman, ("Low voltage current conveyor-based field programmable analog array," Journal of Circuits, Systems, and Computers, vol. 20, no. 8, pp. 1677-1701, 2011—incorporated herein by reference).

A CF is a two terminal device that conveys a current input signal applied at its low impedance input terminal X to a high impedance output terminal Z. Ideally, it is equivalent to a current controlled current source with unity gain, zero input impedance and infinite output impedance as described in P. Allen and M. Terry "The use of current amplifiers for high performance voltage applications", IEEE J. Solid State Circuits, vol. 15, no. 2, pp. 155-162, April 1980—incorporated herein by reference). Mathematically these relation can be written as $I_z=\pm I_x$ and $V_x=0$ and $V_z$ can be set to an arbitrary value. The positive sign denotes inverting CF while the negative sign means non-inverting CF. In current-mode processing, addition and subtraction are simply obtained by connecting respective wires.

Developing a cascadable current mode integrator based on CA includes two options. The first option is through applying the input current at the input terminal X and connecting a shunt integrating capacitor at the output terminal Z to perform integration. Then, the voltage of the capacitor is converted to an output current using a voltage to current converter.

FIG. 1A illustrates a lossy current mode passive integrator 100. The lossy current mode passive integrator includes a resistor 104 connected between a current input terminal Iin (102) and a current output terminal 108, and a capacitor 106 being connected between the current input terminal 102 and a ground node. A more efficient realization is obtained via converting the lossy current mode passive integrator 100 shown in FIG. 1A to a lossless cascadable topology 109 with the help of dual output CF.

Figure 1B:
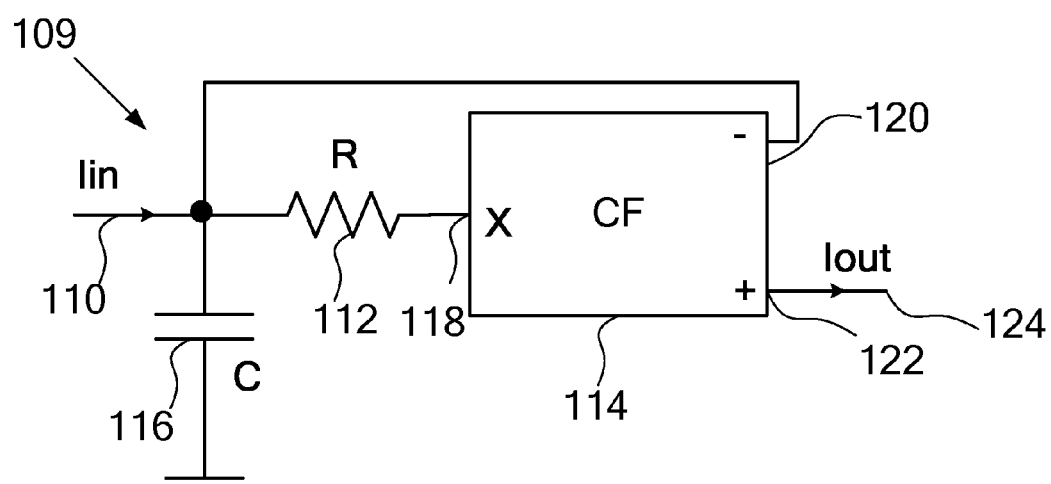
FIG. 1B is an exemplary circuit schematic of a current-follower based cascadable integrator.

FIG. 1B includes a resistor 112, a capacitor 116, and a CF circuit 114. The resistor 112 is connected between a current input terminal 110 and an input terminal 118 of the CF circuit 114. The capacitor 116 is connected between the current input terminal 110 and a ground node. The CF circuit includes the input terminal 118, a non-inverting output 122 and an inverting output 120. The inverting output 120 feedbacks the current signal back to the input terminal 109, and the non-inverting output terminal 122 is connected to a output current terminal 124.

With respect to the CF circuit 114, the input virtual ground is used to sense the current in the resistor 112 whereas the two outputs are used to convert the integrators from lossy to lossless and to provide the output to high impedance terminal as shown in FIG. 1B. The transfer function of the circuit of FIG. 1B is given by:

$$I_{out}=1/sCRI_{in} \qquad (1)$$

Where the complex frequency $s=j\omega$. In the time domain, this relation can be expressed as:

$$I_{out}=1/CR\int I_{in}dt+I_{out}(0) \qquad (2)$$

whereas the differentiator 200 is simply obtained by exchanging the capacitor and resistor.

Figure 2:
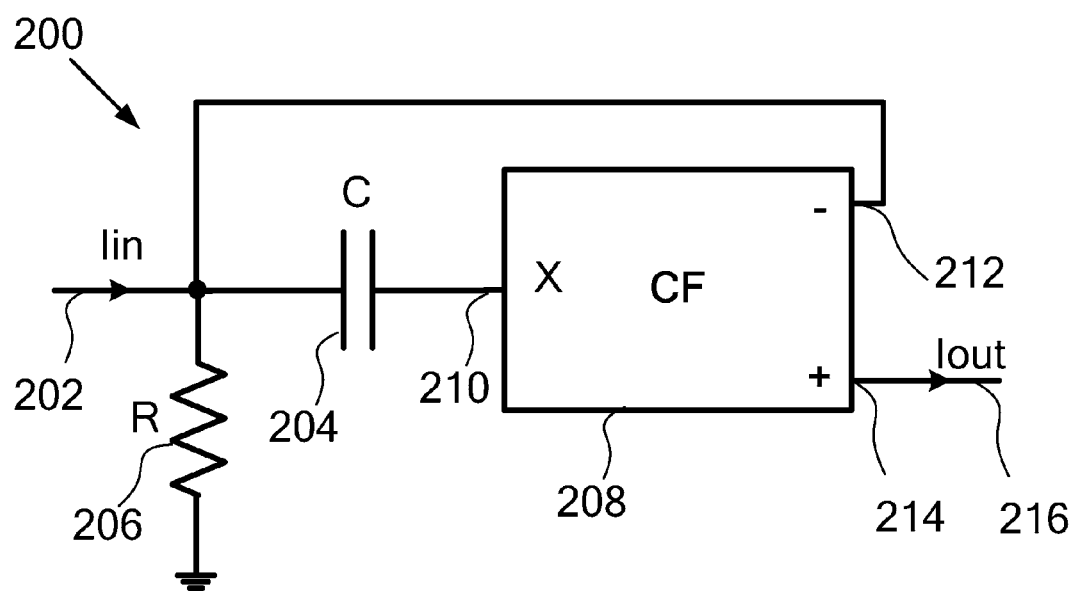
FIG. 2 is an exemplary circuit schematic of a current-follower based cascadable differentiator.

Moreover, FIG. 2 is an exemplary schematic of a CF based cascadable differentiator 200. The differentiator 200 includes a resistor 206, a capacitor 204, and a CF circuit 208. The capacitor 204 is connected between a current input terminal 202 and an input terminal 210 of the CF circuit 208. The resistor 206 is connected between the current input terminal 202 and a ground node. The CF circuit includes the input terminal 210, a non-inverting output 214 and an inverting output 212. The inverting output 212 feeds back the current signal to the input terminal 202, and the non-inverting output terminal 214 is connected to an output current terminal 216.

The transfer function of the differentiator 200 is described as:

$$I_{out}=sCRI_{in} \qquad (3)$$

In time domain, this relation can be expressed as:

$$I_{out}=CR\frac{dI_{in}}{dt} \qquad (4)$$

Figure 3:
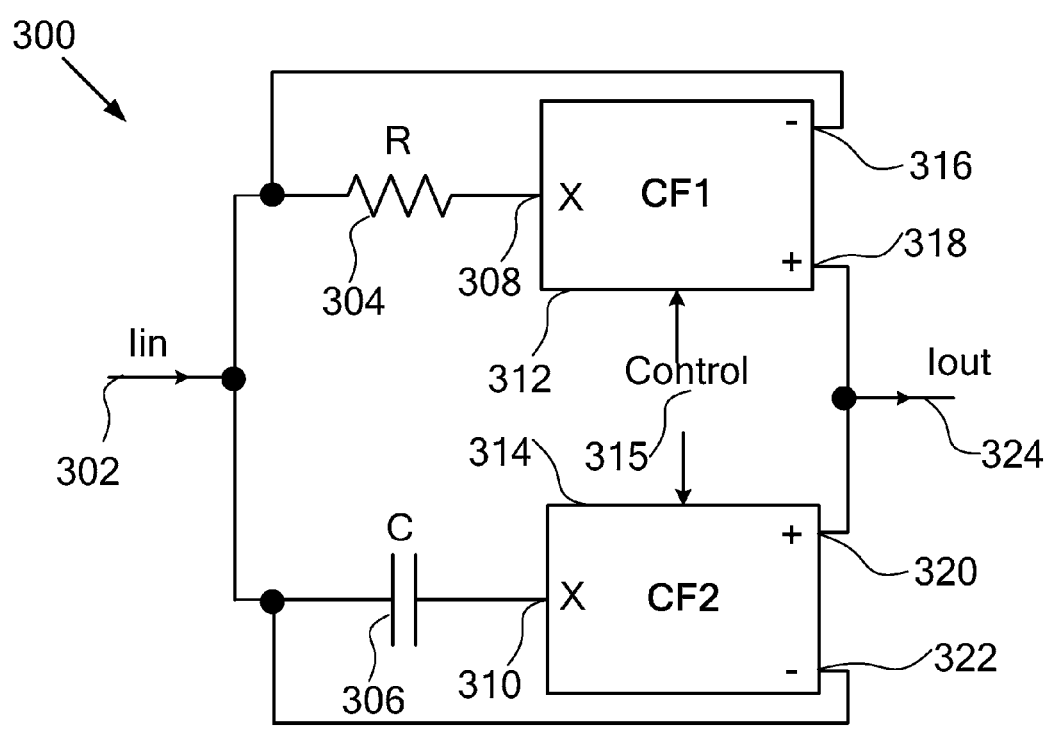
FIG. 3 is an exemplary circuit schematic of a disclosed reconfigurable integrator/differentiator.

Inverting integrator and differentiator can be obtained using positive output stage to provide $I_{out}$ instead of the negative one. A reconfigurable integrator/differentiator is shown in FIG. 3. FIG. 3 is an exemplary circuit schematic of the reconfigurable integrator/differentiator 300.

The Reconfigurable Integrator/Differentiator Circuit 300 includes a resistor 304, a capacitor 306, and two CF circuit (312 and 315). The resistor 304 is connected between a current input terminal 302 and an input terminal 308 of a first CF circuit (CF1) 312. The capacitor 306 is connected between the current input terminal 302 and an input terminal 310 of a second CF circuit (CF2) 314. The first CF circuit (CF1) 312 includes the input terminal 308, an inverting output 316 and an non-inverting output 318. The inverting output 316 feeds back the current signal to the input terminal 302, and the non-inverting output terminal 318 is connected to an output current terminal 324. The second CF circuit (CF2) 314 includes the input terminal 310, a non-inverting output 320 and an inverting output 322. The inverting output 322 feeds back the current signal to the input terminal 302, and the non-inverting output terminal 320 is connected to an output current terminal 324. A control signal 315 is used to configure the circuit 300 to operate either as a differentiator or an integrator.

The proper operation of the circuit requires that the virtual ground $V_x=0$ of both CFs always be maintained. However, the respective output currents are set to zero depending on the type of the required operation. Therefore, integration or differential is obtained when both output currents of the first CF circuit (CF1) 312 or the second CF circuit (CF2) 314 are respectively set to zero. This requires that the input stage of both CF circuits (312 and 314) of FIG. 3 be always on to provide the required virtual grounds. On the other hand, the output stages are switched on according to the desired function. This would require a particular CMOS realization wherein the operation of the input and output stages are independent. The circuit 300 shares passive components (e.g., the resistor 304 and the capacitor 306), and the input and output terminals between the differentiator and the integrator. The share of components of the circuit 300 results in saving area and reducing the required number of input and output pins of the CAB, respectively.

Figure 4:
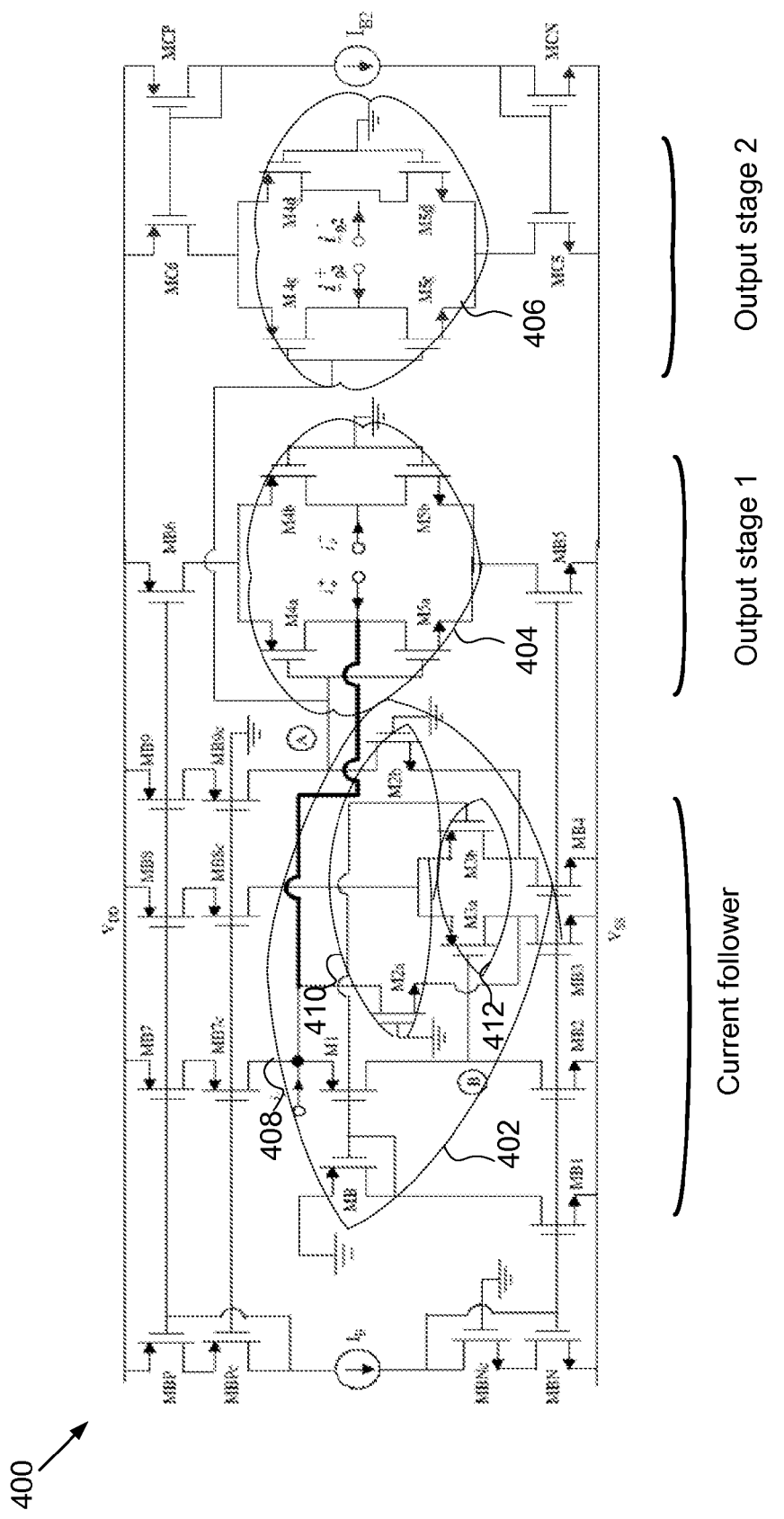
FIG. 4 is an exemplary circuit schematic of a disclosed multiple-output current follower amplifier.

FIG. 4 is an exemplary schematic of the CF circuit used in the disclosed reconfigurable integrator/differentiator circuits. There are several particular CMOS realizations as described in R. Zele, D. Allstot, and T. Fiez, ("Fully balanced CMOS current-mode circuits," *IEEE J Solid-State Circuits*, vol. SC-28, pp. 569-575, May 1993—incorporated herein by reference), S.-I. Liu, J.-J. Chen, and Y.-S. Hwang, "New current mode biquad filters using current followers," IEEE Trans. Circuits Syst. II, vol. 42, pp. 380-383, July 1995—incorporated herein by reference), S. Gupta and R. Senani, ("New voltage-mode/current-mode universal biquad filter using unity-gain cells," Int. J. Electron., vol. 93, pp. 769—775, 2006—incorporated herein by reference), E. Tlelo-Cuatle, M. Duarte-Villasenor, J. Garcia-Ortega, and C. Sanchez-Lopez, ("Designing SRCOs by combining SPICE and Verilog-A," Int. Journal of Electron., vol. 94, pp. 373-379, April 2007—incorporated herein by reference), and G. Cataldoa, R. Mitaa, and S, Pennisi, ("High speed CMOS unity gain current amplifier" Microelectronics Journal, vol. 37, pp. 1086-1091, October 2006—incorporated herein by reference). A high speed (wide bandwidth) low supply voltage, ultra-low input resistance, and multi-outputs CF circuit is disclosed.

As shown in FIG. 4, the CF circuit 400 includes a current follower circuit 402, a first output stage 404 and a second output stage 406. Transistors MB and M1 have the same length and width, and are biased with the same quiescent currents through current source transistor MB1 and MB2. Since the two transistors MB and M1 have the same gate-source voltages and $V_S(M1)=V_S(MB)=0$, this makes the DC voltage at the input node 408 to be equal to zero. The transistors M2-M3 and current generators transistors MB7, MB7c, MB8, MB8c, MB9 and MB9c, implement an auxiliary differential stage. A first differential pair 410 is implemented by the transistors M2a-M2b. The gates of the transistors M2a-M2b are connected to the ground node. A second differential pair 412 is implemented by the transistors M3a-M3b. The gates of the transistor M3a-M3b are biased as the drain voltage of the transistors MB and M1, thereby minimizing the errors in the input bias voltage caused by channel length modulation. The first and second differential pairs 410 and 412 form a folded-cascade structure, and the second differential pair 412 are implemented by p-channel transistors. The folded cascade differential amplifier allows a reduced supply voltage.

The first output stage 404 is implemented by a third complementary differential pair M4a-M4b and M5a-M5b. The differential output currents from the first output stage 404 are a non-inverting current output $i_o^+$ and an inverting current output $i_o^-$. The second output stage 406 is implemented by a fourth complementary differential pair M4c-M4d and M5c-M5d. The differential output currents from the second output stage 406 are a non-inverting current output $i_{o2}^+$ and an inverting current output $i_{o2}^-$. The second output stage 406 is connected in parallel with original output stage M4a-M4b and M5a-M5b to provide additional current outputs. By feeding the non-inverting output current ($i_o^+$) of the first output stage 404 to the input current $i_i$, a closed-loop unity gain configuration is achieved. A feedback from the closed loop reduces the initially small open loop resistance ($1/g_{m1}$). Therefore, the virtual ground property is satisfied for both DC and ac operation. Furthermore feedback loop adjust the negative output current ($i_o^-$) to closely follow the input current ($i_i$).

When the two output stages are biased with same tail currents (e.g., $I_{B2}=I_B$), the magnitude of the three currents $i_o^-$, $i_{o2}^-$ and $i_{o2}^+$ would be equal with their respective directions shown in FIG. 4. Extra output currents can be obtained by adding more output stages with each stage providing both positive and negative signals. Furthermore $i_{o2}^-$ and $i_{o2}^+$ can be set to zero independently through switching off the biasing current ($I_{B2}$).

The amplifier of FIG. 4 was fabricated in 0.35 µm process. The supply voltages and biasing current are set to ±3.512V and $I_B=30$ µA leading to a total power ($V_{DD} \times 10 I_B + V_{SS} \times 11 I_B$) of approximately 1 mW. The design is optimized to reduce the DC offset currents of both the input and output stages. The input offset current was trimmed through resizing the width of MB2 to 11.7 µm and output offset currents were minimized through adjusting the width of MB5=19.6 µm. It can be seen that the amplifier exhibits linear characteristics over ±60 µA with small offset currents of few nAs. Bandwidths of more than 500 MHz are observed.

Figure 5:
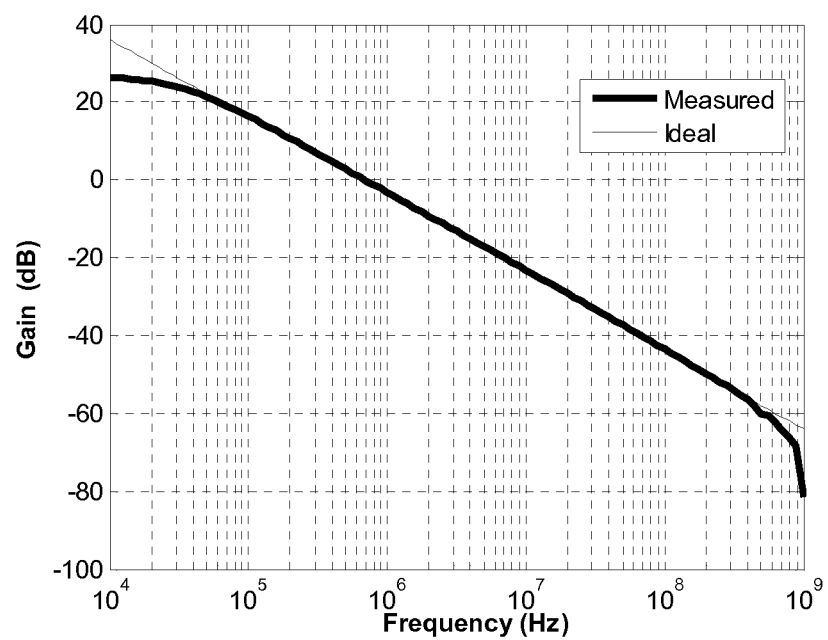
FIG. 5 is a graph that shows AC responses of the disclosed reconfigurable integrator/differentiator functioning as an integrator.
Figure 6:
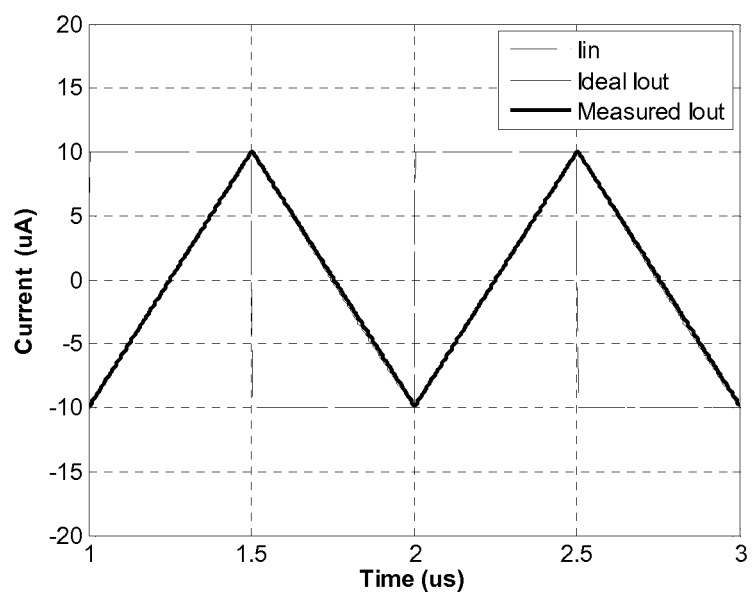
FIG. 6 is a graph that time domain testing of the disclosed reconfigurable integrator/differentiator functioning as an integrator.
Figure 7:
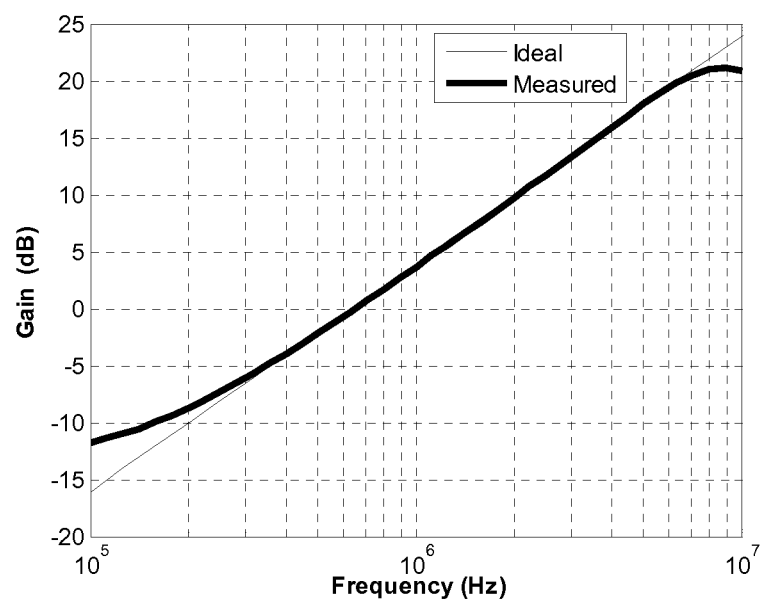
FIG. 7 is a graph that shows AC response of the disclosed reconfigurable integrator/differentiator functioning as an integrator.

An AC response of the reconfigurable integrator/differentiator functioning as a integrator is shown in FIG. 5. The response is obtained using C of 5 pF and R of 50 kΩ. The simulation results closely follow the measurement response over the range of 40 kHz to 400 MHz. The deviation at very low frequency is due to finite output resistance of the CF ($r_z$) whereas the high frequency limit is due to the finite bandwidth of the CF. The response of the integrator due to a square-wave input with amplitude of 10 uA and frequency of 500 kHz is shown in FIG. 6. It can be seen that the experimental results and the ideal results are in very close agreements. An AC response of the disclosed reconfigurable integrator/differentiator functioning as a differentiator is shown in FIG. 7. It can be seen that the experimental results closely follows the ideal response over the range of 300 kHz to 7 MHz.

The disclosed circuit adopts the current-follower (CF) amplifier as the core building block to implement an integrator/differentiator circuit. The circuit provides functional reconfiguration with the same hardware resources. Such reconfiguration can be used as a CAB utilized in FPAA applications. The circuit includes a reduced number of passive and active components. A single capacitor is utilized for both integration and differentiation operations leading to considerable area saving particularly when large capacitors were required. Also, the circuit does not suffer from the problems of limited input/output signal swing associated with the voltage followers employed, for example, in CCII or CFA. The switches in a signal path are avoided through adopting direct connection between on/off output stages of the CFs.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

The invention claimed is:

1. A reconfigurable integrator/differentiator circuit, comprising:
    a first input terminal input of the circuit;
    a first output terminal output of the circuit;
    a first current follower amplifier having a second input terminal of a first current follower, a second inverting output terminal, and a third non-inverting output terminal, wherein the second inverting output terminal provides feed back to the first input terminal and the third non-inverting output terminal is directly connected to the first output terminal;
    a second current follower amplifier having a third input terminal of the second current follower, a fourth inverting output terminal, and a fifth non-inverting output terminal, wherein the fourth inverting output terminal provides feed back to the first input terminal and the fifth non-inverting output terminal is directly connected to the first output terminal;
    a single resistor being connected between the first input terminal and the second input terminal of the first current follower amplifier; and a single capacitor being connected between the first input terminal and the third input terminal of the second current follower amplifier.

2. The circuit of claim 1, wherein the single resistor and the single capacitor are used for both integration and differentiation operations to reduce silicon area.

3. The circuit of claim 1, wherein the first current follower amplifier and the second current follower amplifier include one or more differential pairs in parallel with a first output stage to provide multiple output currents.

4. The circuit of claim 3, wherein respective input stages and output stages of the first current follower amplifier and the second current follower amplifier operate independently through controlling a biasing current at the output stages.

5. The circuit of claim 4, wherein the circuit operates as an integrator when output stages of the first current follower amplifier are turned on and output stages of the second current follower amplifier are turned off, and the circuit operates as a differentiator when the output stages of the first current follower amplifier are turned off and the output stages of the second current follower are turned on.

6. The circuit of claim 3, wherein the first current follower amplifier and the second current follower amplifier include feedback loops to reduce the input resistance, maintain virtual ground for AC operation, and adjust the first output currents to follow the input current.

* * * * *